United States Patent
Zhou et al.

(10) Patent No.: US 11,322,595 B2
(45) Date of Patent: May 3, 2022

(54) HETEROJUNCTION BIPOLAR TRANSISTOR AND PREPARATION METHOD THEREOF

(71) Applicant: Yanshan University, Qinhuangdao (CN)

(72) Inventors: Chunyu Zhou, Qinhuangdao (CN); Zuowei Li, Qinhuangdao (CN); Guanyu Wang, Qinhuangdao (CN); Xin Geng, Qinhuangdao (CN)

(73) Assignee: Yanshan University, Qinhuangdao (CN)

( * ) Notice: Subject to any disclaimer, the term of this patent is extended or adjusted under 35 U.S.C. 154(b) by 0 days.

(21) Appl. No.: 17/209,334

(22) Filed: Mar. 23, 2021

(65) Prior Publication Data
US 2021/0305379 A1 Sep. 30, 2021

(30) Foreign Application Priority Data
Mar. 24, 2020 (CN) .......................... 202010215352.4

(51) Int. Cl.
*H01L 29/417* (2006.01)
*H01L 29/66* (2006.01)
*H01L 29/737* (2006.01)

(52) U.S. Cl.
CPC .. *H01L 29/41708* (2013.01); *H01L 29/66242* (2013.01); *H01L 29/7375* (2013.01)

(58) Field of Classification Search
CPC ......... H01L 29/41708; H01L 29/66242; H01L 29/7375; H01L 29/0821; H01L 29/1004; H01L 29/7378; H01L 29/7371; H01L 29/0817
See application file for complete search history.

(56) References Cited

U.S. PATENT DOCUMENTS

| 5,340,753 A * | 8/1994 | Bassous | H01L 29/1004 438/366 |
| 6,699,741 B1 * | 3/2004 | Sadovnikov | H01L 29/66242 438/339 |
| 2007/0238258 A1 * | 10/2007 | Adam | H01L 29/1004 257/592 |

* cited by examiner

Primary Examiner — Syed I Gheyas
(74) Attorney, Agent, or Firm — IPro, PLLC

(57) ABSTRACT

The disclosure provides a heterojunction bipolar transistor and a preparation method thereof. Since an emitter region has the same physical structure as a base region, and improves frequency characteristics of the device; Simultaneously with biaxial strain, uniaxial strain is introduced. Carrier transmission time in the collector region will be effectively reduced. By this structure, the width of the effective collector region is reduced, the collector junction capacitance is reduced, and the frequency characteristics of the device are further improved; an appropriate choice of the thickness of the Si cap layer can effectively reduce the accumulation of carriers at an interface and increase the gain of the device; at the same time, the preparation method of the bipolar transistor is completely compatible with a 90-nanometer CMOS process, which effectively reduces the development and manufacturing cost of the device.

4 Claims, 8 Drawing Sheets ered in the step 9;

HETEROJUNCTION BIPOLAR TRANSISTOR AND PREPARATION METHOD THEREOF

TECHNICAL FIELD

The present disclosure relates to the technical field of semiconductor integrated circuits, in particular to a heterojunction bipolar transistor and a preparation method thereof.

BACKGROUND

The CMOS process has entered the 7 nm/5 nm node and is about to reach the end of the process development roadmap. In this context, the improvement of transistor performance mainly uses strain engineering, high-K metal gates, and the transition from a planar structure to a three-dimensional structure. Starting from the 90 nm process, the standard CMOS process mainly adopts the selective deposition method of the SiGe layer in the source drain regions to introduce uniaxial stress in the channel region of the device. The introduction of stress can significantly increase the carrier mobility, thereby improve the performance of the device. However, in an actual circuit, as the size of the device decreases, the current drive capability of the device decreases, and the chip delay caused by the interconnection between the devices will be more significant. At the same time, the 1/f noise of CMOS in high-frequency circuit becomes more and more serious as the size of the device decreases, becoming a relatively insurmountable threshold.

In SiGe heterojunction bipolar transistor (HBT), a small amount of Ge is added to the base region of a Si-based bipolar junction transistor (BJT). The base region uses SiGe material, which significantly improves the device performance, making SiGe HBT a standard bipolar transistor in high-speed applications. The SiGe-based process heterojunction bipolar transistor developed on the basis of mature silicon technology takes advantage of "energy band engineering" and fundamentally solves the contradiction between increasing magnification and improving frequency characteristics. The device has a higher cutoff frequency ($f_T$) and maximum oscillation frequency ($f_{max}$), and a higher transconductance gm makes SiGe HBT more promising for high-frequency applications than nanowire and FinFET. Although the performance of III-V compound HBT is better than SiGe HBT, it is not compatible with CMOS process, and the process is unstable. Inaccurate model leads to low yield and greatly increases cost.

However, in order to continuously improve the performance of the device, the reported high-frequency SiGe HBTs all use the SiGe BiCMOS process. Although the performance of the device, especially its high-frequency characteristics, has been greatly improved, the long process development cycle and high production cost have restricted the development and technological transformation of SiGe HBT.

SUMMARY

The purpose of the present disclosure is to provide a heterojunction bipolar transistor and a preparation method thereof.

To solve the above technical problems, the present disclosure provides the following technical solutions:

A heterojunction bipolar transistor, wherein the transistor selects a P-type doped single crystal Si with a crystal orientation of (110) as a substrate; a N+ doped single crystal Si layer is epitaxially formed on the single crystal Si substrate as a buried layer; an N– doped single crystal Si layer is epitaxially formed on the surface of the buried layer as a collector region; three STI structures with a thickness of 400 nm are formed in the collector region to realize the isolation between a collector and a base, and the right region of the collector region is N+ doped; the N– doped collector region is ion implanted to form the P+ doped on both sides as a non-intrinsic base region; a $SiO_2$ layer with a thickness of 1-2 µm is deposited on the surface of the device to define the position of an active region; after a P-type SiGe layer base region, an intrinsic Si cap layer and a N+ doped polycrystalline Si layer emitter region are selective epitaxially formed in the active region, a nitride layer is deposited on the surface of the device; the nitride layer and the Sift layer are photoetched, and the P+ doped non-intrinsic base region is etched; and then an embedded SiGe layer is selective epitaxially formed; a polycrystalline SiGe layer is epitaxially formed on the embedded SiGe layer, and a $SiO_2$ layer is re-deposited on the surface of the device; and then CMP is performed; a nitride layer is re-deposited on the surface of the device; the nitride layer re-deposited is photoetched, the $SiO_2$ layer with a thickness of 1-2 µm and the $SiO_2$ layer re-deposited are etched, and metal silicide is deposited, to form contact of an emitter, the base and the collector.

Preferably, the emitter region has the same physical structure as the base region.

Preferably, the width of the emitter region is 90 nanometers.

The present disclosure also provides a method for preparing a heterojunction bipolar transistor, which includes the following specific steps:

Step 1: selecting a P-type Initial material with a single crystal silicon doping concentration of $10^{15}$ cm$^{-3}$ and a crystal orientation of (110) as a substrate;

Step 2: epitaxially forming a N+ doped single crystal Si layer with a doping concentration of $10^{18}$ cm$^{-3}$ on a P-type doped single crystal Si substrate as a buried layer;

Step 3: epitaxially forming an N– doped single crystal Si layer with a doping concentration of $10^{16}$ cm$^{-3}$ on the surface of the N+ doped buried layer as a collector region;

Step 4: forming three STI structures with a thickness of 400 nm on the collector region obtained in the step 3 to realize the isolation between a collector and a base;

Step 5: using Mask1 to N+ dope a region between two STI structures on the right side obtained in Step 4 as a collector region contact;

Step 6: depositing a $SiO_2$ layer with a thickness of 50 nm on the upper surface of the device obtained in Step 5, and using Mask2 to photoetch the $SiO_2$ layer;

Step 7: using the $SiO_2$ layer obtained in the step 6 as a masking layer to P+ dope the N– doped collector region, and the P+ doped region serves as a part of the non-intrinsic base region of the device;

Step 8: removing the $SiO_2$ masking layer obtained in the step 7, and depositing an $SiO_2$ layer with a thickness of 1-2 µm on the upper surface of the device;

Step 9: using Mask3 to etch the $SiO_2$ layer obtained in step 8 and define the position of an active region, and then selective epitaxially forming a P-type SiGe layer as a base region, an intrinsic Si cap layer and a N+ doped Polycrystalline Si layer as an emitter region;

Step 10: depositing a nitride layer on the upper surface of the device obtained in the step 9;

Step 11: using Mask4 to etch the nitride layer obtained in Step 10;

Step 12: etching the Sift layer obtained in step 8 to obtain a through hole layer;

Step 13: etching the P+ doped region obtained in the step 7, and selective epitaxially forming an embedded SiGe layer;

Step 14: selective epitaxially forming a polycrystalline SiGe layer on the embedded SiGe layer obtained in the step 13;

Step 15: re-depositing an $SiO_2$ layer on the through hole layer, and then performing CMP;

Step 16: depositing a nitride layer on the upper surface of the device obtained in step 15, and using Mask5 to etch the nitride layer;

Step 17: etching the Sift layer on the device obtained in step 15;

Step 18: depositing a silicide to form metal contact, and then forming collector contact, base contact, and emitter contact.

Compared with the prior art, the present disclosure has the following beneficial effects:

Since an emitter region has the same physical structure as a base region, the heterojunction bipolar transistor of the present disclosure effectively reduces a parasitic effect between an emitter region and a base region, and improves frequency characteristics of the device; the width of the emitter region is 90 nanometers, such that an intrinsic resistance of the base region is effectively reduced; the embedded SiGe structure is adopted on both sides of the collector region; Simultaneously with biaxial strain, uniaxial strain is introduced to improve carrier mobility. Carrier transmission time in the collector region is effectively reduced. By this structure, the width of the effective collector region is reduced, the collector junction capacitance is reduced, and the frequency characteristics of the device are further improved; an appropriate thickness of the Si cap layer can effectively reduce the accumulation of carriers at an interface and increase the gain of the device; at the same time, the preparation method of the bipolar transistor is completely compatible with a 90-nanometer CMOS process, which effectively reduces the development and manufacturing cost of the device.

IN FIGURES

100—P type doped single crystal Si substrate, 101—N+ doped single crystal Si buried layer, 102—N− doped single crystal Si collector region, 103—STI structure, 104—N+ doped collector region contact, 105—$SiO_2$ masking layer after photoetched, 106—P+ doped non-intrinsic base region, 107—$SiO_2$ layer with a thickness of 1-2 μm, 108—P type SiGe base region, 109—Si cap layer, 110—polysilicon emitter region, 111—nitride layer, 112—nitride layer after photoetched, 113—through hole layer, 114—embedded SiGe layer, 115—polycrystalline SiGe layer, 116—re-deposited $SiO_2$ Layer, 117—nitride layer after photoetched, 118—emitter contact, 119—base contact, 120—collector contact.

DETAILED DESCRIPTION

Hereinafter, embodiments of the present disclosure will be described with reference to the drawings.

Figure 1:
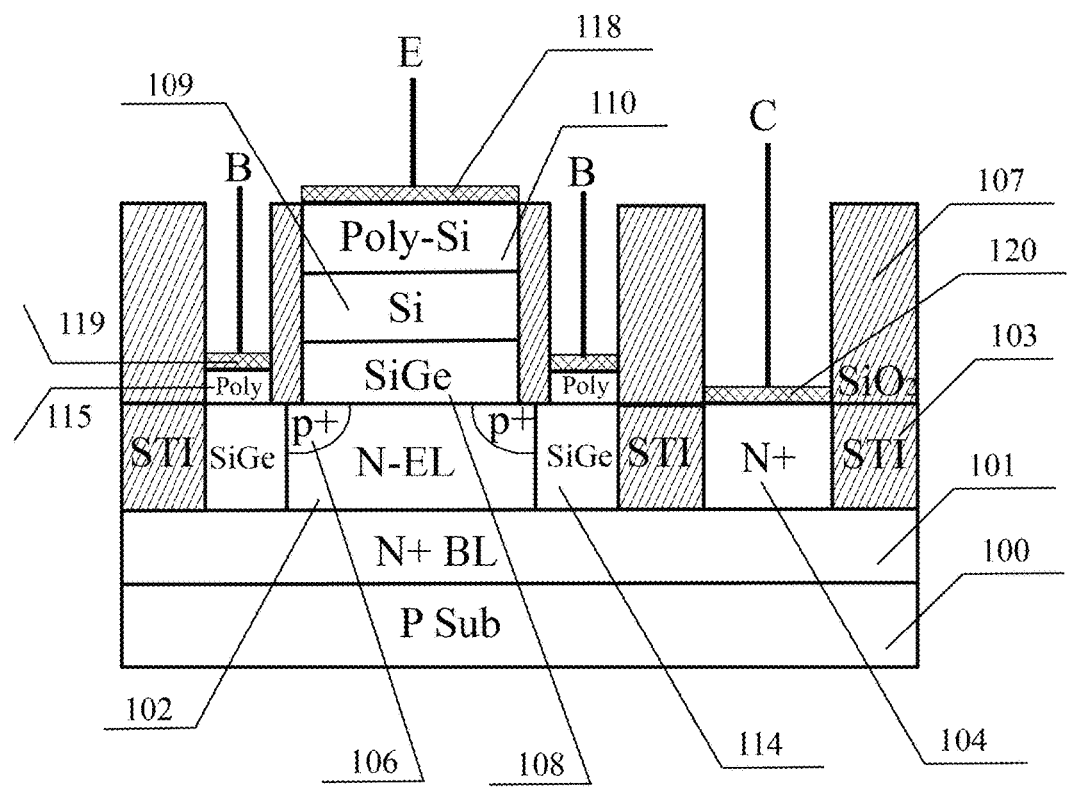
FIG. 1 is a schematic cross-sectional view of an embodiment of the present disclosure.

As shown in FIG. 1, the heterojunction bipolar transistor of the present disclosure selects a P-type doped single crystal Si substrate with a crystal orientation of (110); a N+ doped single crystal Si layer is epitaxially formed on the substrate as a buried layer; an N− doped single crystal Si layer is epitaxially formed on the surface of the buried layer as a collector region; three STI structures with a thickness of 400 nm are formed in the collector region to realize the isolation between a collector and a base, and the right region of the collector region is N+ doped; the N− doped collector region is ion implanted to form the P+ doped on both sides as a non-intrinsic base region; a $SiO_2$ layer with a thickness of 1-2 μm is deposited on the surface of the device to define the position of an active region; a P-type SiGe layer, an intrinsic Si cap layer and a N+ doped polycrystalline Si layer are selective epitaxially formed in the active region; a nitride layer is deposited on the surface of the device; the nitride layer and the $SiO_2$ layer are photoetched, and the P+ doped non-intrinsic base region is etched; and then an embedded SiGe layer is selective epitaxially formed; a polycrystalline SiGe layer is deposited on the surface of the embedded SiGe layer; and a $SiO_2$ layer is re-deposited on the surface of the device, and CMP is performed; a nitride layer is deposited on the surface of the device; the nitride layer and the Sift layer is photoetched, and metal silicide is deposited, to form contact of an emitter, the base and the collector.

Figure 2:
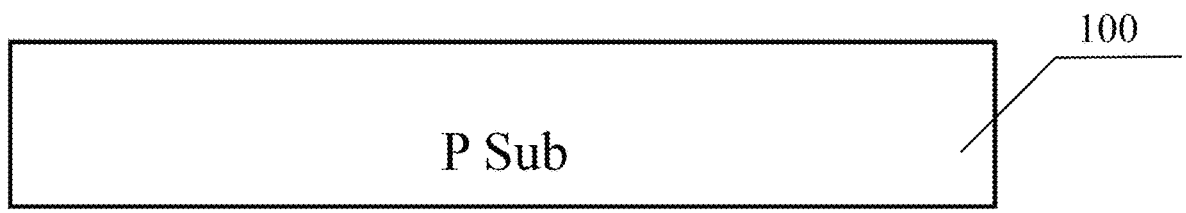
FIG. 2 is a schematic diagram of a P-type doped single crystal Si substrate in an embodiment of the present disclosure.
Figure 3:
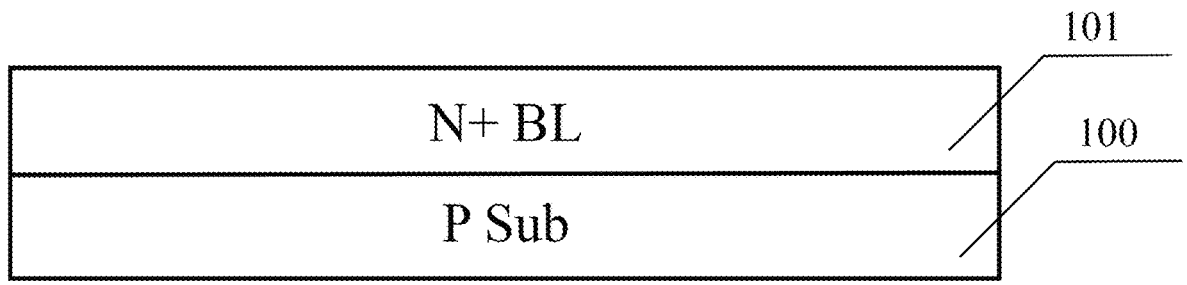
FIG. 3 is a schematic diagram of a device obtained through step 2 in an embodiment of the present disclosure.
Figure 4:
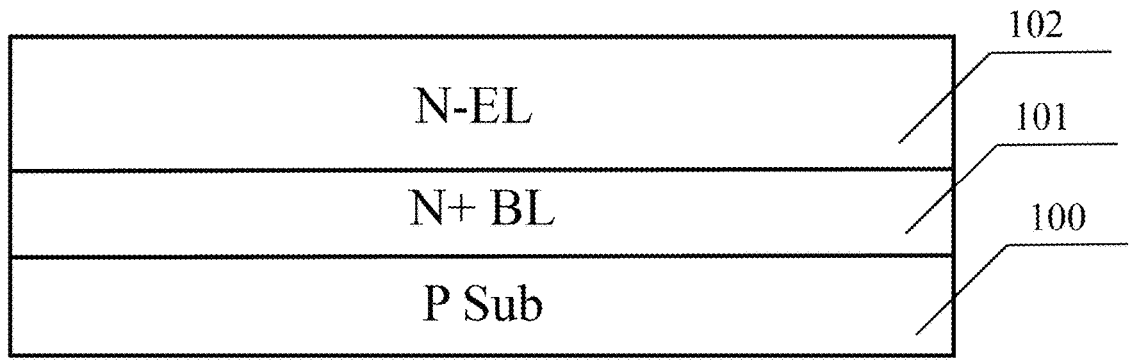
FIG. 4 is a schematic diagram of a device obtained through step 3 in an embodiment of the present disclosure.
Figure 5:
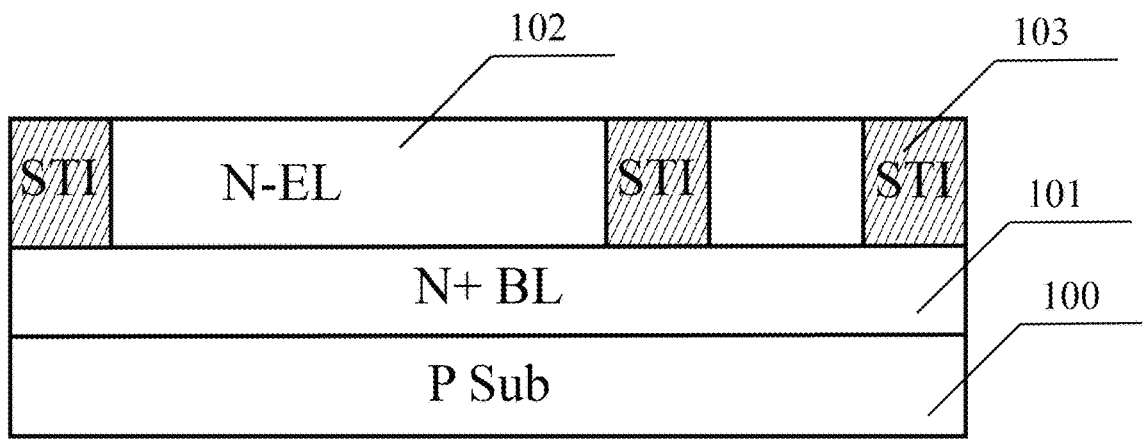
FIG. 5 is a schematic diagram of a device obtained through step 4 in an embodiment of the present disclosure.
Figure 6:
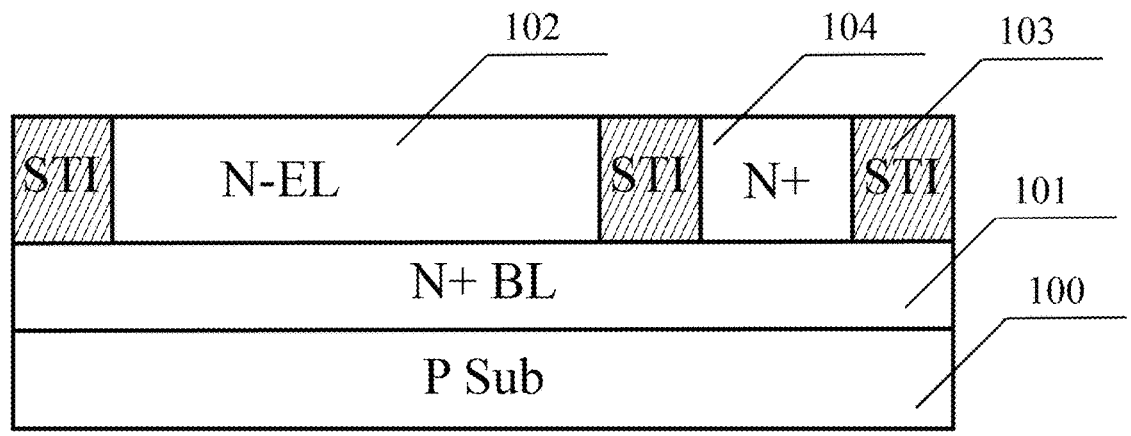
FIG. 6 is a schematic diagram of a device obtained through step 5 in an embodiment of the present disclosure.
Figure 7:
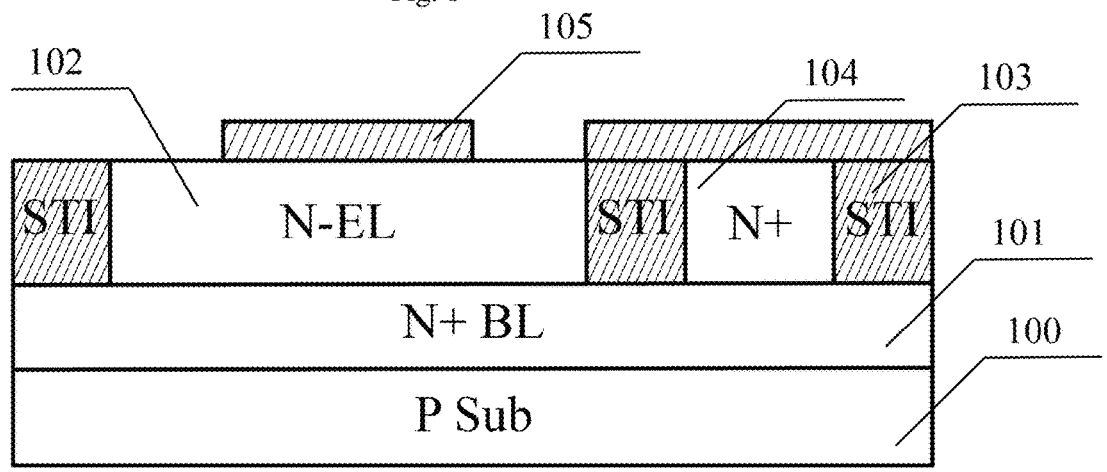
FIG. 7 is a schematic diagram of a device obtained through step 6 in an embodiment of the present disclosure.
Figure 8:
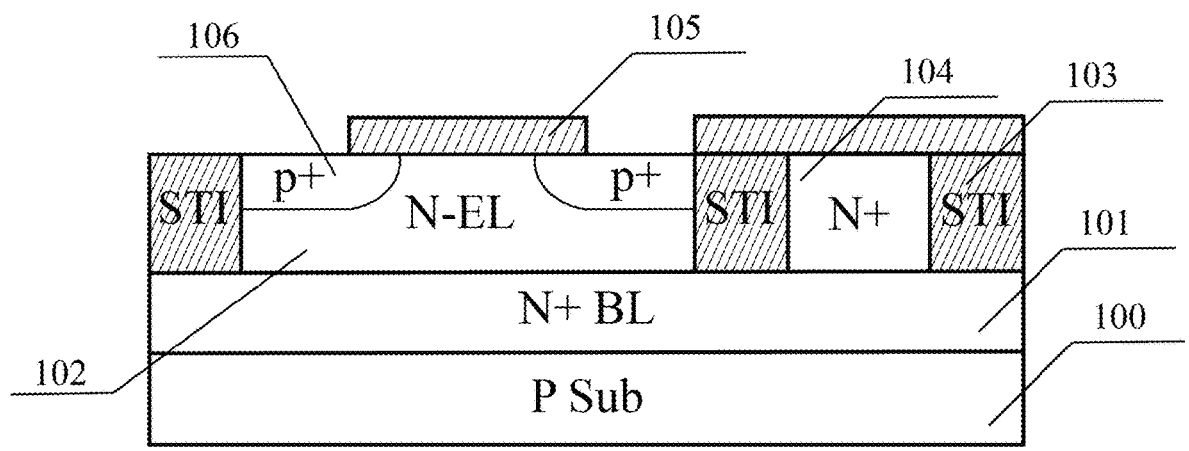
FIG. 8 is a schematic diagram of a device obtained through step 7 in an embodiment of the present disclosure.
Figure 9:
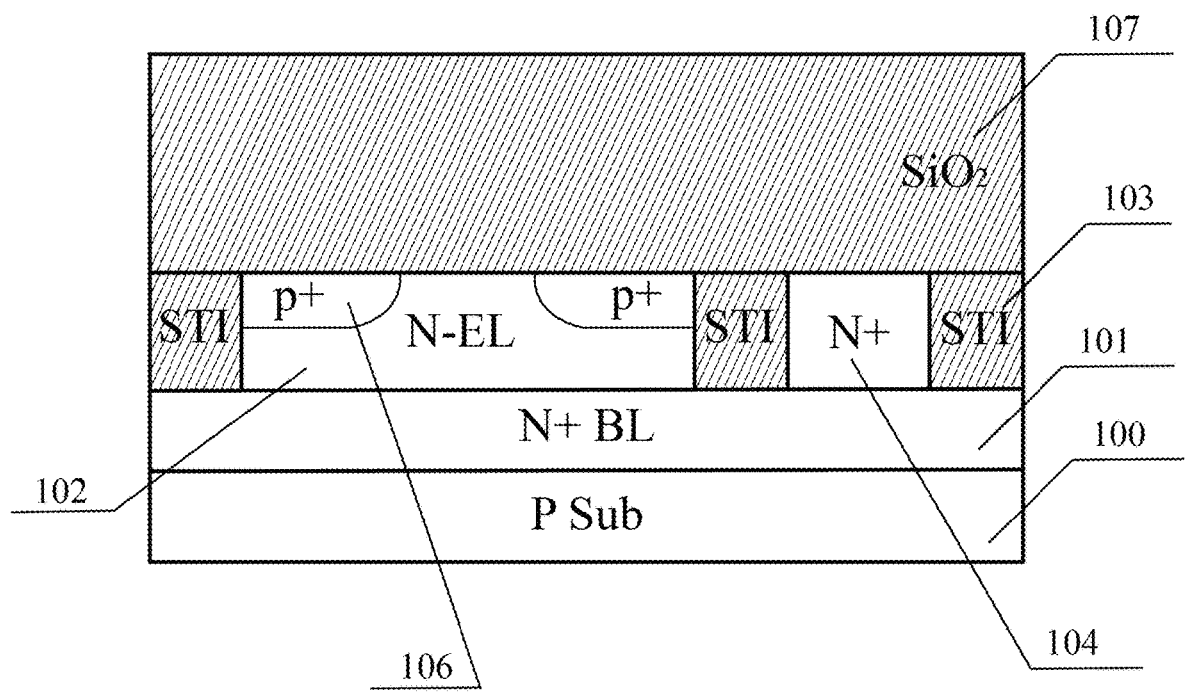
FIG. 9 is a schematic diagram of a device obtained through step 8 in an embodiment of the present disclosure.
Figure 10:
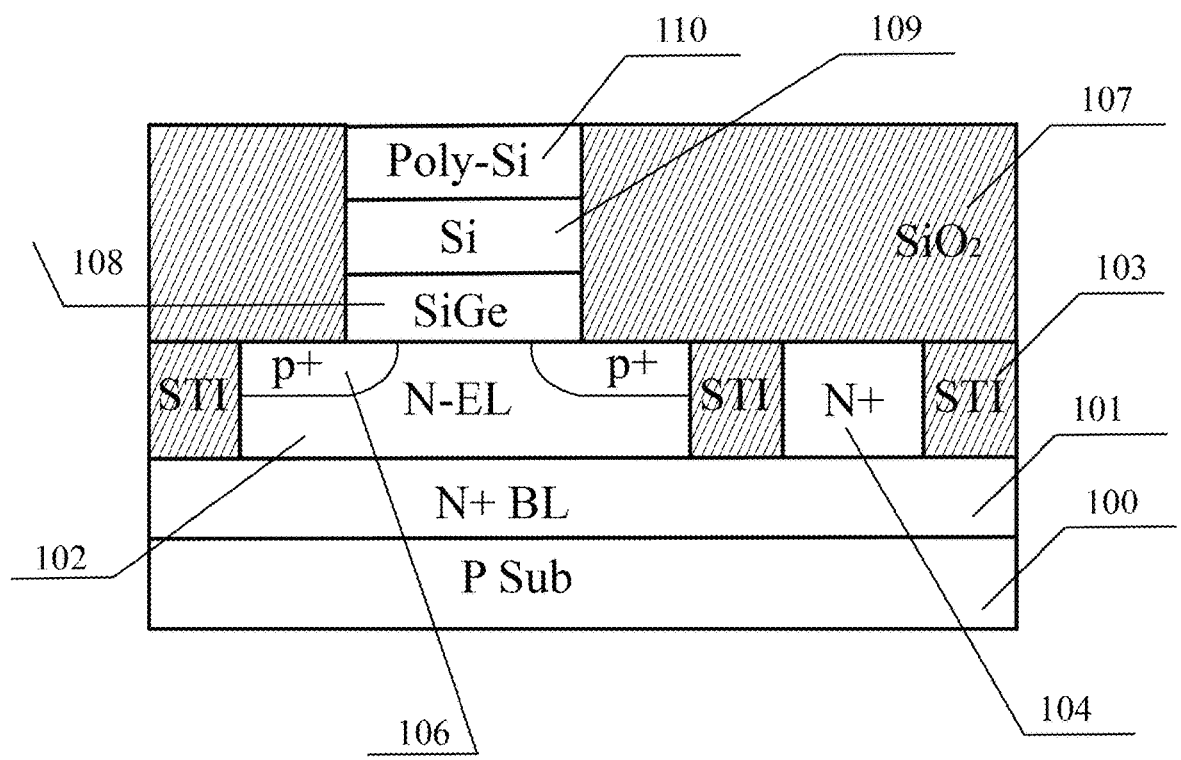
FIG. 10 is a schematic diagram of a device obtained through step 9 in an embodiment of the present disclosure.
Figure 11:
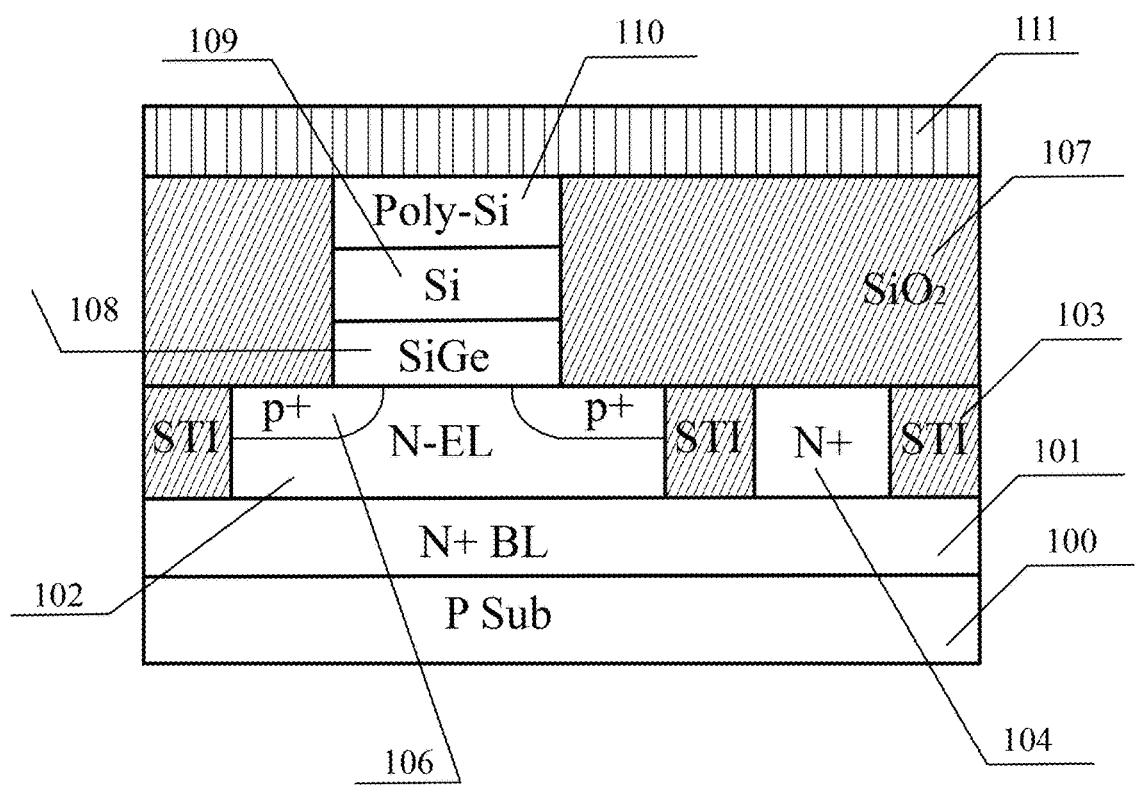
FIG. 11 is a schematic diagram of a device obtained through step 10 in an embodiment of the present disclosure.
Figure 12:
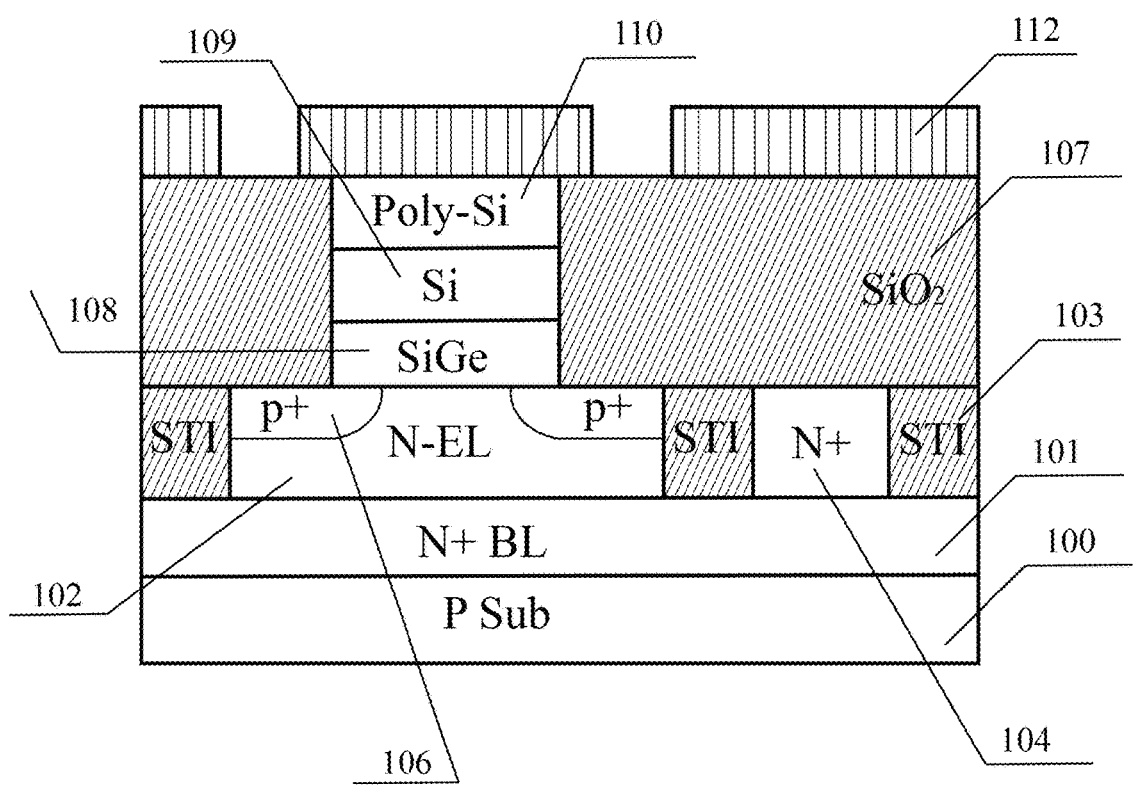
FIG. 12 is a schematic diagram of a device obtained through step 11 in an embodiment of the present disclosure.
Figure 13:
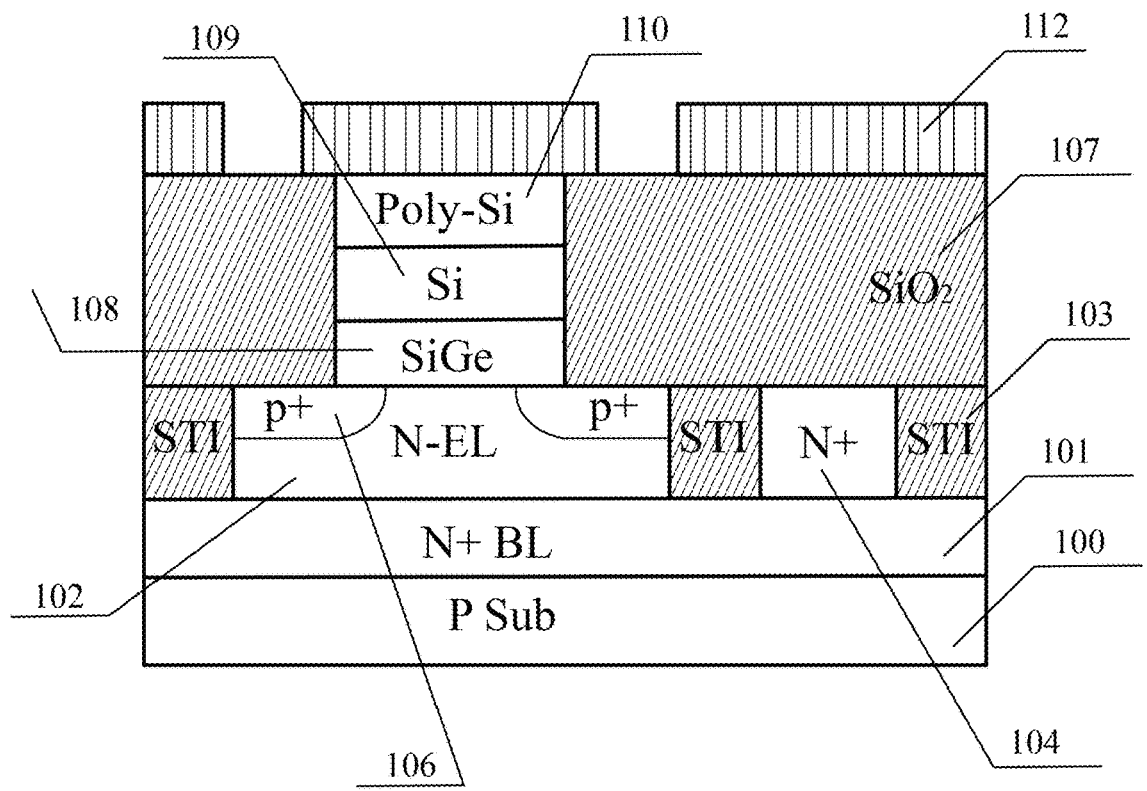
FIG. 13 is a schematic diagram of a device obtained through step 12 in an embodiment of the present disclosure.
Figure 14:
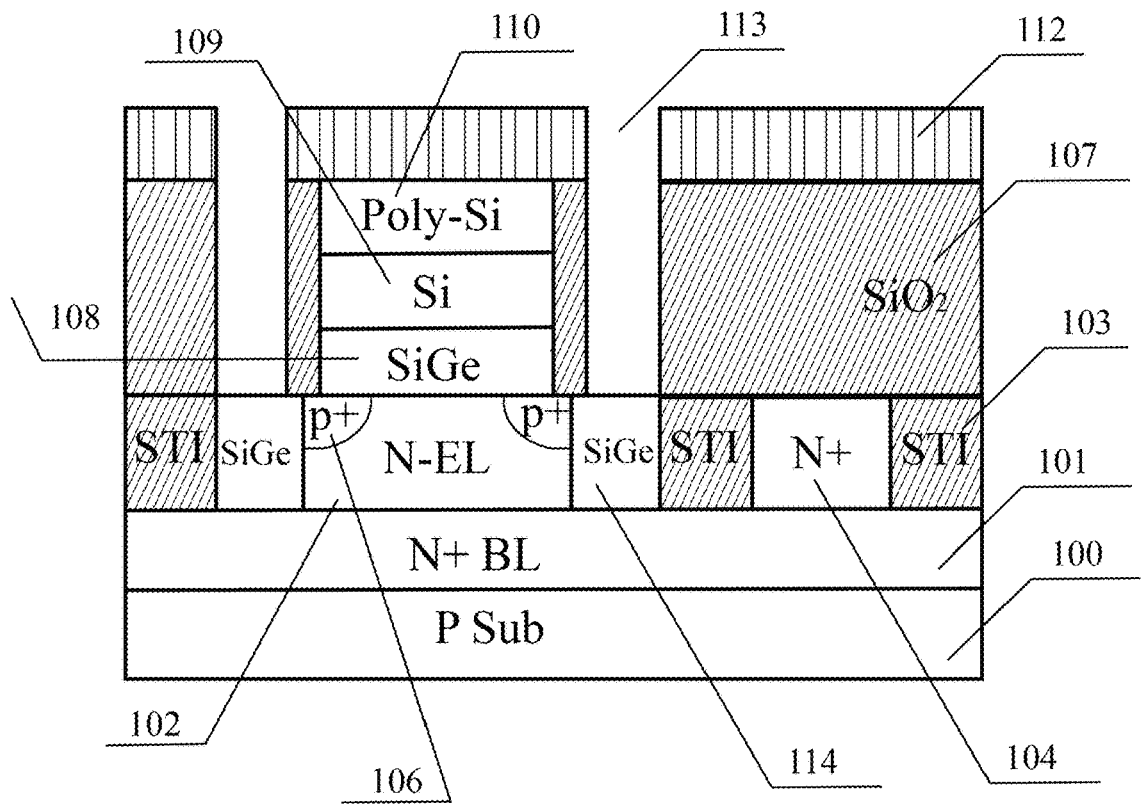
FIG. 14 is a schematic diagram of a device obtained through step 13 in an embodiment of the present disclosure.
Figure 15:
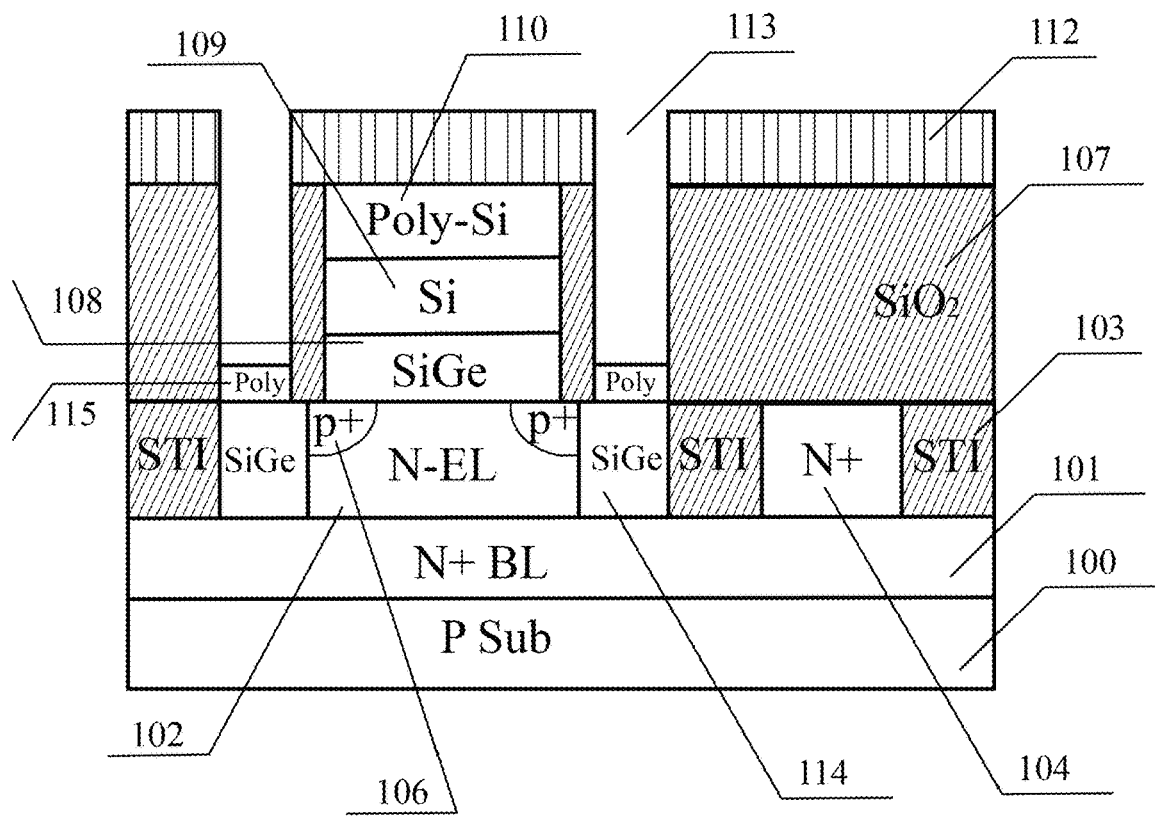
FIG. 15 is a schematic diagram of a device obtained through step 14 in an embodiment of the present disclosure.
Figure 16:
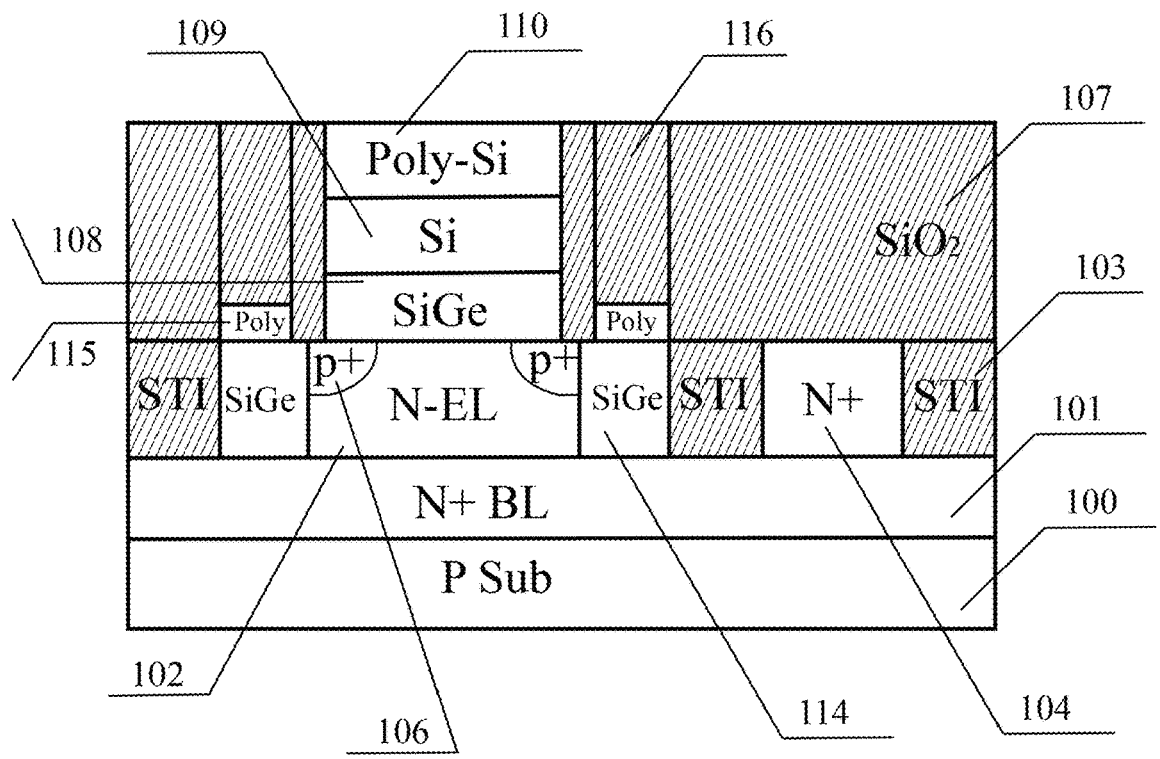
FIG. 16 is a schematic diagram of a device obtained through step 15 in an embodiment of the present disclosure.
Figure 17:
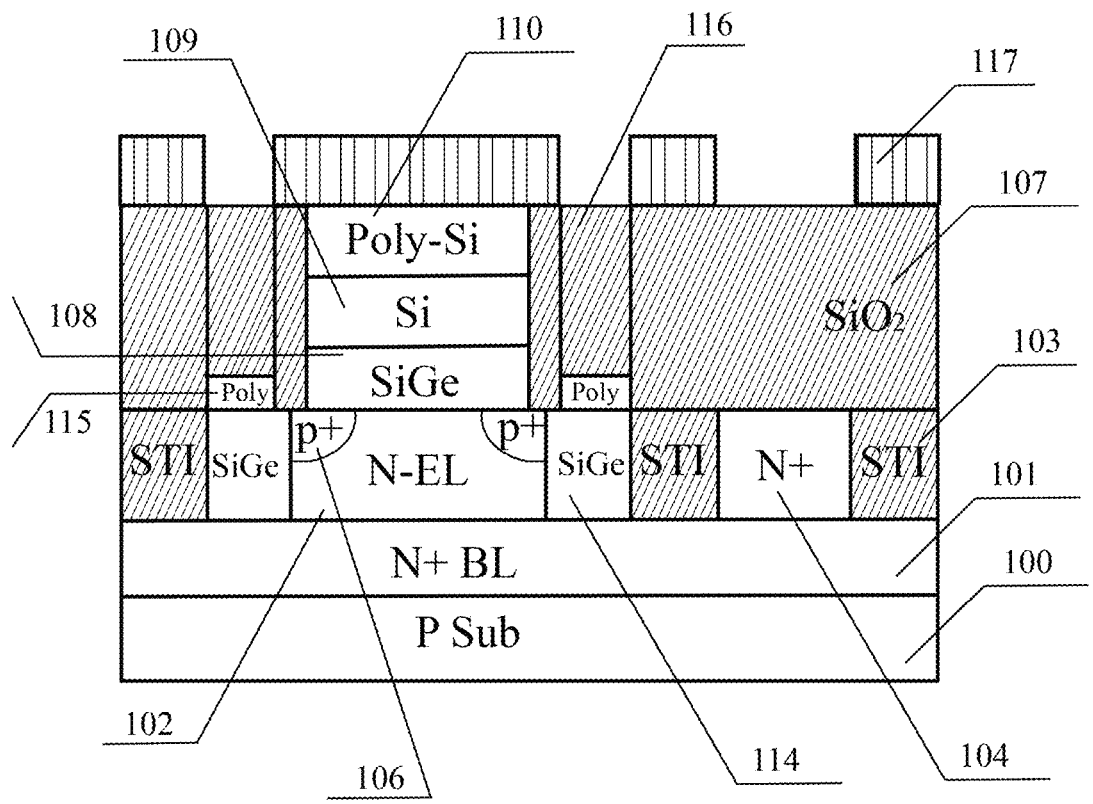
FIG. 17 is a schematic diagram of a device obtained through step 16 in an embodiment of the present disclosure.
Figure 18:
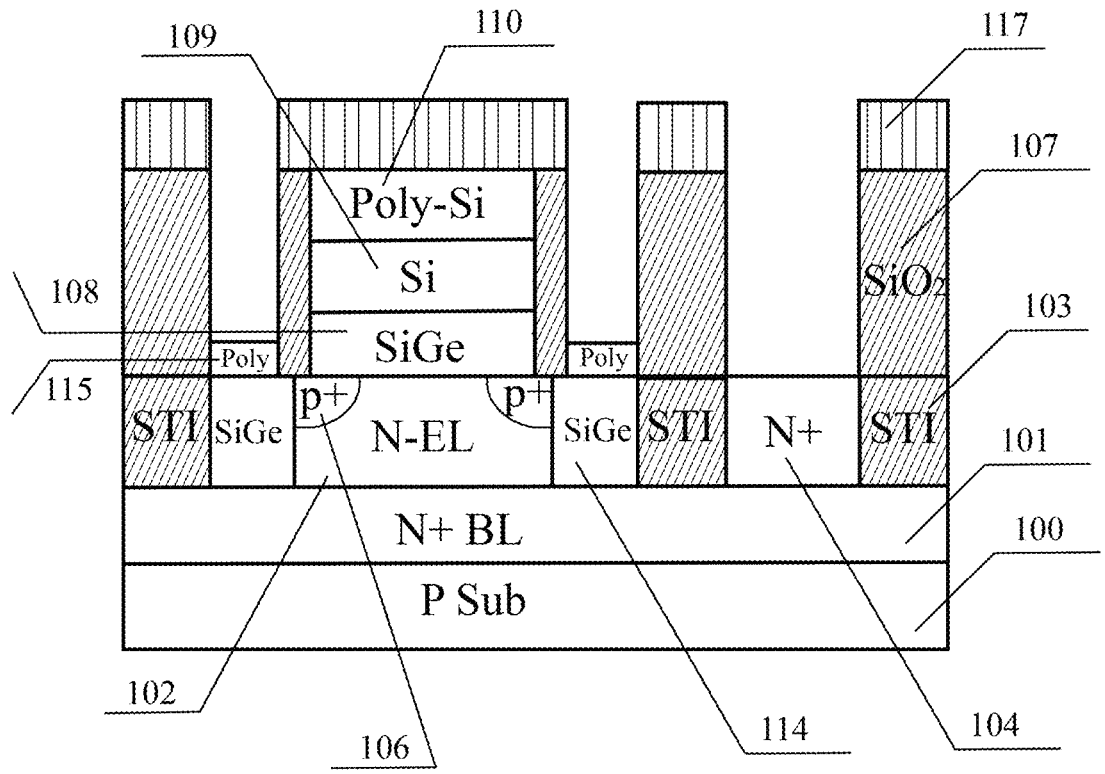
FIG. 18 is a schematic diagram of a device obtained through step 17 in an embodiment of the present disclosure.

The present disclosure also provides a method for preparing a heterojunction bipolar transistor, the preparation steps are as follows:

Step 1, as shown in FIG. 2, select P-type doped single crystal Si with a single crystal silicon doping concentration of $10^{15}$ $cm^{-3}$ crystal orientation (110) as a substrate;

Step 2, epitaxially form a layer of N+ doped single crystal Si buried layer 101 on the P-type doped single crystal Si substrate 100. As shown in FIG. 3, the doping concentration of the epitaxial layer is $10^{18}$ cm$^{-3}$;

Step 3, on the surface of the N+ doped single crystal Si buried layer 101, an N− doped single crystal Si layer 102 is epitaxially formed as a collector region, as shown in FIG. 4, the doping concentration of the epitaxial layer is $10^{16}$ cm$^{-3}$;

Step 4, three STI structures 103 with a thickness of 400 nm are formed on the N− doped single crystal Si layer 102 to realize the isolation between a collector and a base, as shown in FIG. 5;

Step 5, using Mask1, ion implantation is performed on a region between two STI structures 103 on the right side to form an N+ doped collector region contact 104, as shown in FIG. 6;

Step 6, deposit a SiO$_2$ layer with a thickness of 50 nm on the upper surface of the device obtained in step 5, and use Mask2 to photoetch the SiO$_2$ layer to obtain a photoetched SiO$_2$ masking layer 105, as shown in FIG. 7;

Step 7, use the SiO$_2$ mask layer 105 after photoetched to ion implant the N− doped collector region after step 5 to obtain a P+ doped non-intrinsic base region 106, as shown in FIG. 8;

Step 8, remove the SiO$_2$ mask layer 105 after photoetched, and deposit an SiO$_2$ layer 107 with a thickness of 1-2 μm on the surface of the device, as shown in FIG. 9;

Step 9, use Mask3 to etch the SiO$_2$ layer 107 with a thickness of 1-2 μm and define the position of an active region, and then selective epitaxially form a P-type SiGe base region 108, an intrinsic Si cap layer 109 and a polysilicon emitter region 110, as shown in FIG. 10;

Step 10, deposit a nitride layer 111 on a surface of the device, as shown in FIG. 11;

Step 11, use Mask4 to etch a nitride layer 111 to obtain a nitride layer 112 after photoetched, as shown in FIG. 12;

Step 12, etch a SiO$_2$ layer 107 with a thickness of 1-2 μm to obtain a through hole layer 113, as shown in FIG. 13;

Step 13, etch the P+ doped non-intrinsic base region 106, and selective epitaxially form an embedded SiGe layer 114, as shown in FIG. 14;

Step 14, selective epitaxially form a polycrystalline SiGe layer 115 on the embedded SiGe layer 114, as shown in FIG. 15;

Step 15, re-deposit an SiO$_2$ layer 116 on the through hole layer 113, and then perform CMP, as shown in FIG. 16;

Step 16, a nitride layer is deposited on the surface of the device, and Mask5 is used, and the nitride layer 117 after photoetched is shown in FIG. 17;

Step 17, etch the re-deposited SiO$_2$ layer 116 and the SiO$_2$ layer 107 with a thickness of 1-2 μm, as shown in FIG. 18;

Step 18, deposit silicide to form metal contact, and then form emitter contact 118, base contacts 119, and collector contacts 120, as shown in FIG. 1.

The above-mentioned embodiments only describe the preferred embodiments of the present disclosure, and do not limit the scope of the present disclosure. Without departing from the design spirit of the present disclosure, those of ordinary skill in the art have made various contributions to the technical solutions of the present disclosure. Such modifications and improvements should fall within the scope of protection determined by the claims of the present disclosure.

What is claimed is:

1. A heterojunction bipolar transistor, characterized in that the transistor selects a P-type doped single crystal Si with a crystal orientation of (110) as a substrate; a N+ doped single crystal Si layer is epitaxially formed on the single crystal Si substrate as a buried layer; an N− doped single crystal Si layer is epitaxially formed on the surface of the buried layer as a collector region; three STI structures with a thickness of 400 nm are formed in the collector region to realize the isolation between a collector and a base, and the right region of the collector region is N+ doped; the N− doped collector region is ion implanted to form the P+ doped on both sides as a non-intrinsic base region; a SiO$_2$ layer with a thickness of 1-2 μm is deposited on the surface of the device to define the position of an active region; after a P-type SiGe layer base region, an intrinsic Si cap layer and a N+ doped polycrystalline Si layer emitter region are selective epitaxially formed in the active region, a nitride layer is deposited on the surface of the device; the nitride layer and the SiO$_2$ layer are photoetched, and the P+ doped non-intrinsic base region is etched; and then an embedded SiGe layer is selective epitaxially formed; a polycrystalline SiGe layer is epitaxially formed on the embedded SiGe layer, and a SiO$_2$ layer is re-deposited on the surface of the device, and CMP is performed; a nitride layer is re-deposited on the surface of the device; the nitride layer re-deposited is photoetched, the SiO$_2$ layer with a thickness of 1-2 μm and the SiO$_2$ layer re-deposited are etched, and metal silicide is deposited, to form contact of an emitter, the base and the collector.

2. The heterojunction bipolar transistor according to claim 1, wherein the emitter region has the same physical structure as the base region.

3. The heterojunction bipolar transistor according to claim 1, wherein the width of the emitter region is 90 nanometers.

4. A method for preparing a heterojunction bipolar transistor, characterized in that comprising the following specific steps:

Step 1. selecting a P-type Initial material with a single crystal silicon doping concentration of $10^{15}$ cm$^{-3}$ and a crystal orientation of (110) as a substrate;

Step 2: epitaxially forming a N+ doped single crystal Si layer with a doping concentration of $10^{18}$ cm$^{-3}$ on a P-type doped single crystal Si substrate as a buried layer;

Step 3: epitaxially forming an N− doped single crystal Si layer with a doping concentration of $10^{16}$ cm$^{-3}$ on the surface of the N+ doped buried layer as a collector region;

Step 4: forming three STI structures with a thickness of 400 nm on the collector region obtained in the step 3 to realize the isolation between a collector and a base;

Step 5: using Mask1 to N+ dope a region between two STI structures on the right side obtained in Step 4 as a collector region contact;

Step 6: depositing a SiO$_2$ layer with a thickness of 50 nm on the upper surface of the device obtained in Step 5, and using Mask2 to photoetch the SiO$_2$ layer;

Step 7: using the SiO$_2$ layer obtained in the step 6 as a masking layer to P+ dope the N− doped collector region, and the P+ doped region serves as a part of the non-intrinsic base region of the device;

Step 8: removing the SiO$_2$ masking layer obtained in the step 7, and depositing an SiO$_2$ layer with a thickness of 1-2 μm on the upper surface of the device;

Step 9: Using Mask3 to etch the SiO$_2$ layer obtained in step 8 and define the position of an active region, and then selective epitaxially forming a P-type SiGe layer as a base region, an intrinsic Si cap layer and a N+ doped Polycrystalline Si layer as an emitter region;

Step 10: depositing a nitride layer on the upper surface of the device obtained in the step 9;

Step 11: Using Mask4 to etch the nitride layer obtained in Step 10;

Step 12: etching the $SiO_2$ layer obtained in step 8 to obtain a through hole layer;

Step 13: etching the P+ doped region obtained in the step 7, and selective epitaxially forming an embedded SiGe layer;

Step 14: selective epitaxially forming a polycrystalline SiGe layer on the embedded SiGe layer obtained in the step 13;

Step 15: re-depositing an $SiO_2$ layer on the through hole layer, and then performing CMP;

Step 16: depositing a nitride layer on the upper surface of the device obtained in step 15, and using Mask5 to etch the nitride layer;

Step 17: etching the $SiO_2$ layer on the device obtained in step 15;

Step 18: depositing a silicide to form metal contact, and then forming collector contact, base contact, and emitter contact.

* * * * *